United States Patent [19]
Xiang et al.

[11] Patent Number: 5,960,322
[45] Date of Patent: Sep. 28, 1999

[54] SUPPRESSION OF BORON SEGREGATION FOR SHALLOW SOURCE AND DRAIN JUNCTIONS IN SEMICONDUCTORS

[75] Inventors: Qi Xiang, Santa Clara; Geoffrey Yeap, Sunnyvale; Srinath Krishnan, Mountain View; Ming-Ren Lin, Cupertino, all of Calif.

[73] Assignee: Advanced Micro Devices, Inc., Sunnyvale, Calif.

[21] Appl. No.: 08/994,308

[22] Filed: Dec. 19, 1997

[51] Int. Cl.$^6$ .......................... H01L 21/31; H01L 21/469
[52] U.S. Cl. .......................... 438/791; 438/199; 438/508; 438/509; 438/526; 438/529; 438/530; 438/763; 438/917
[58] Field of Search .......................... 438/479, 514, 438/527, 530, 923, 199, 508, 509, 526, 529, 763, 791, 917, 934, 976

[56] References Cited

U.S. PATENT DOCUMENTS 5,154,946  10/1992  Zdebel ..................................... 438/207
5,476,799  12/1995  Sakamoto et al. ....................... 438/530
5,510,648   4/1996  Davies ..................................... 257/657
5,525,529   6/1996  Guldi ....................................... 438/565
5,599,726   2/1997  Pan ......................................... 438/304

OTHER PUBLICATIONS

Wolf, Stanley; Silicon Processing for the VLSI Era, vol. 1; p. 187, 305–8, 1986.
Wolf, Stanley; Silicon Processing for the VLSI Era, vol. 2; p. 212–14, 1990.

Primary Examiner—Charles Bowers
Assistant Examiner—Nema Berezny
Attorney, Agent, or Firm—Mikio Ishimaru

[57] ABSTRACT

A method in the manufacture of ultra-large scale integrated circuit semiconductor devices suppresses boron loss due to segregation into the screen oxide during the boron activation rapid thermal anneal. A nitridation of the screen oxide is used to incorporate nitrogen into the screen oxide layer prior to boron implantation for ultra-shallow, source and drain extension junctions. A second nitridation of a second screen oxide is used prior to boron implantation for deeper, source and drain junctions. This method significantly suppresses boron diffusion and segregation away from the silicon substrate which reduces series resistance of the complete source and drain junctions.

11 Claims, 6 Drawing Sheets

//5,960,322//

SUPPRESSION OF BORON SEGREGATION FOR SHALLOW SOURCE AND DRAIN JUNCTIONS IN SEMICONDUCTORS

TECHNICAL FIELD

The present invention relates generally to semiconductor manufacturing technology and more specifically to deep-submicron P-channel Metal-Oxide Semiconductor (MOS) transistor manufacturing.

BACKGROUND ART

Deep-submicron Complementary Metal-Oxide-Semiconductor (CMOS) is the primary technology for ultra-large scale integrated (ULSI) circuits. Scaling of CMOS has been the principal focus of the microelectronics industry over the last two decades. As device sizes are scaled down, the source and drain junctions have to scale down accordingly to suppress the so-called short channel effects (SCE) which degrade the performance of scaled MOS devices. A major problem related to source and drain junctions is that the source and drain series resistance increases as the devices are scaled down, which degrade the device performance.

Advanced MOS transistors today have shallow source and drain junctions, which consist of shallow source and drain extension junctions to suppress SCE, and relatively deep source and drain junctions to improve series resistance. The resistance from shallow source and drain extension junctions is a large portion of the total series resistance. As extension junctions become shallower and shallower, the series resistance tends to become greater and greater. In order to make the source and drain series resistance low, high doping density is needed in the shallow extension junctions.

Generally, the shallow source and drain extension junctions and the relatively deep source and drain junctions are implemented by ion implantation of dopant through a screen oxide ($SiO_2$) layer. Implantation through an oxide layer results in the deposition of recoiled oxygen into the silicon. This oxygen has a tendency to reduce the interstitial silicon which is present in the implant-damaged substrate. This, in turn, suppresses the diffusion tail associated with the implanted dopant, which moves by an interstitialcy mechanism. This increases the series resistance.

For N-channel Metal-Oxide-Semiconductor (NMOS) transistors, Group V elements are used as dopants.

For P-channel Metal-Oxide-Semiconductor (PMOS) transistors, Group III elements are used, with boron (B) being the most commonly used dopant for both the shallow extension junctions and the relatively deep source and drain junctions. Boron is incorporated into the silicon through ion implantation of either boron atoms or boron difluoride ($BF_2$).

After ion implantation, the dopants need to be activated by a thermal treatment-usually a rapid thermal annealing (RTA). This causes a significant problem in that boron atoms tend to segregate from the silicon substrate into the screen oxide layer during the RTA of dopant activation. Boron segregation results in a decrease of boron concentration in the silicon substrate near its surface and therefore an increase of source and drain series resistance. This effect becomes more and more of a problem as device sizes are continuously scaled down and the extension and junction depths becomes shallower and shallower.

DISCLOSURE OF THE INVENTION

The present invention overcomes the problem that dopant atoms tend to segregate from silicon substrate into the screen oxide layer during the RTA of dopant activation by nitridizing the screen oxide layer into the oxynitride before the implantation of the dopant.

The present invention has the advantage of suppressing boron loss in silicon through segregation into the screen oxide layer during the boron activation RTA.

The present invention also has the advantage of providing advanced, deep submicron CMOS devices with overall ultra-shallow junctions which have low series resistance.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
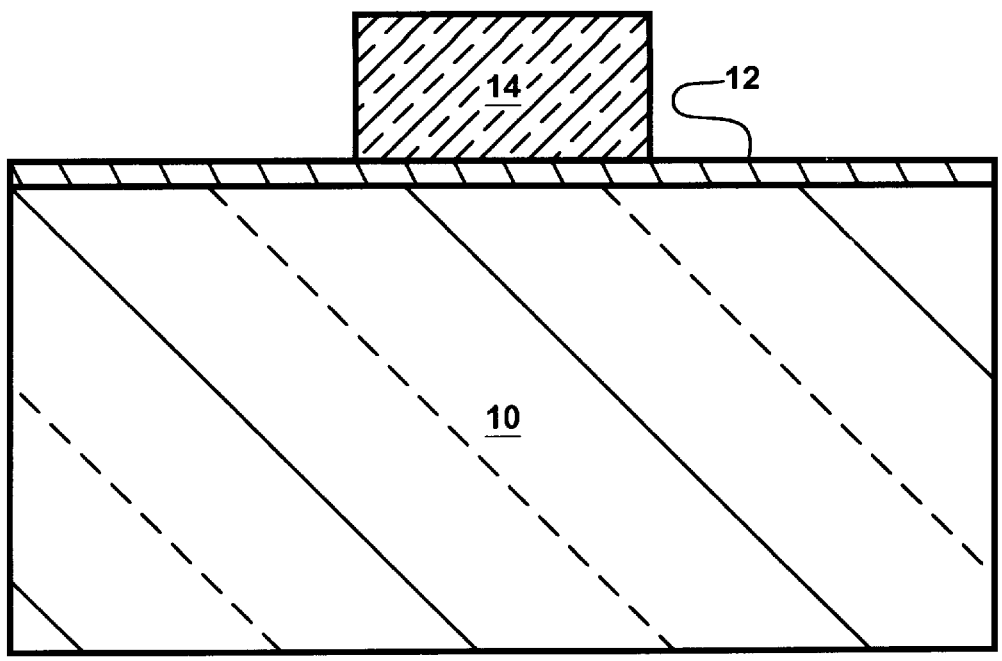
FIG. 1 is a cross-section of a semiconductor transistor gate area.

Referring now to FIG. 1, therein is shown a cross-section of a partially processed semiconductor wafer. The semiconductor wafer has been processed to the point at which a silicon substrate 10 has a silicon dioxide ($SiO_2$) gate oxide layer 12 deposited on top. On top of the gate oxide layer 12 is a polysilicon (polycrystalline silicon) gate 14. The polysilicon gate 14 is positioned over an area or well of N$^-$ silicon. There are a number of different processing steps well known to those skilled in the art for arriving at the structure shown in FIG. 1.

Figure 2:
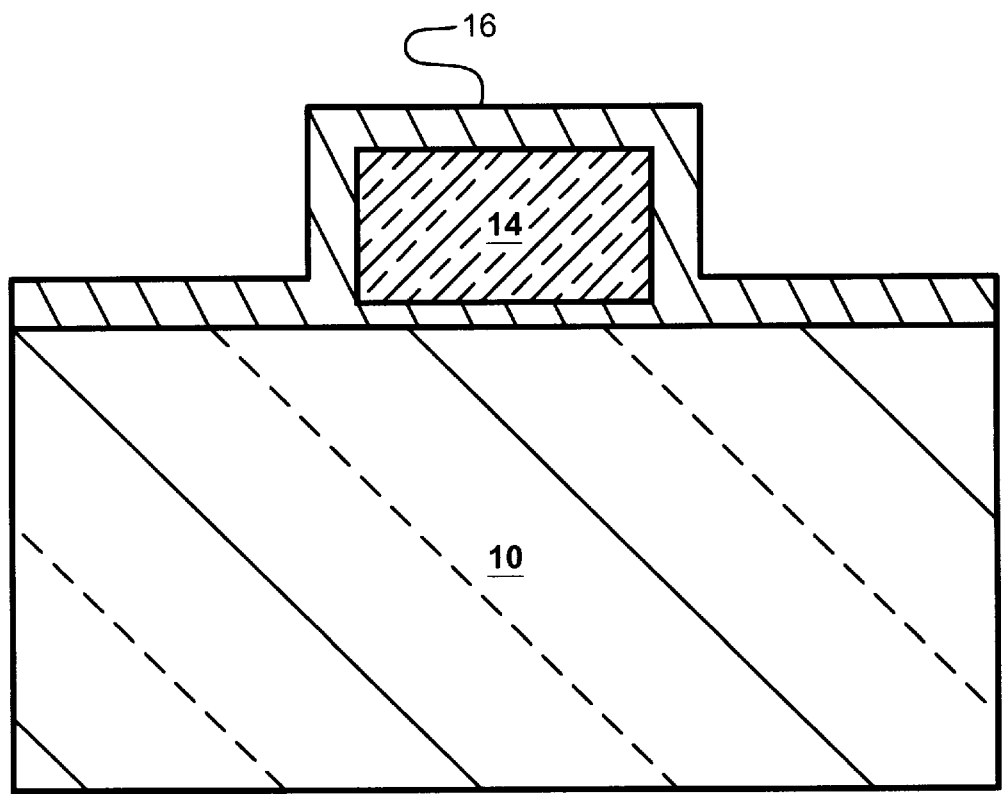
FIG. 2 is the semiconductor of FIG. 1 after screen oxide layer deposition.

Referring now to FIG. 2, therein is shown the silicon substrate 10 and the polysilicon gate 14 having a screen oxide layer 16 of silicon dioxide deposited thereon.

Figure 3:
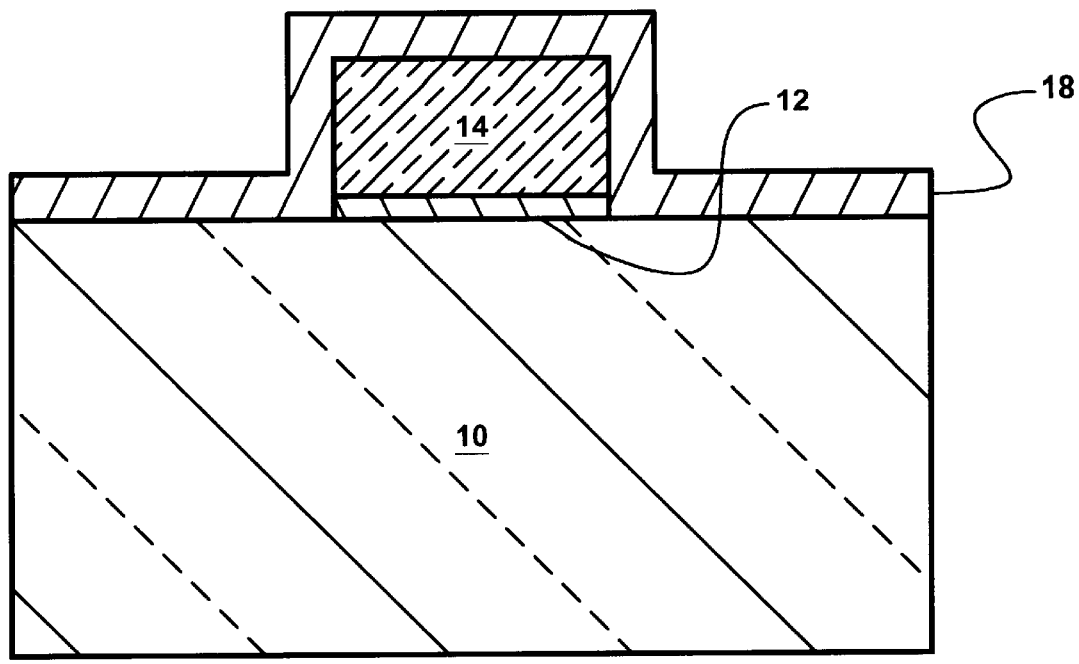
FIG. 3 is the semiconductor of FIG. 2 after screen oxide layer nitridation.

Referring now to FIG. 3, therein is shown a screen oxynitride layer 18 after nitridation which converts the silicon dioxide of the screen oxide layer 16 of FIG. 2 into a silicon oxynitride.

Figure 4:
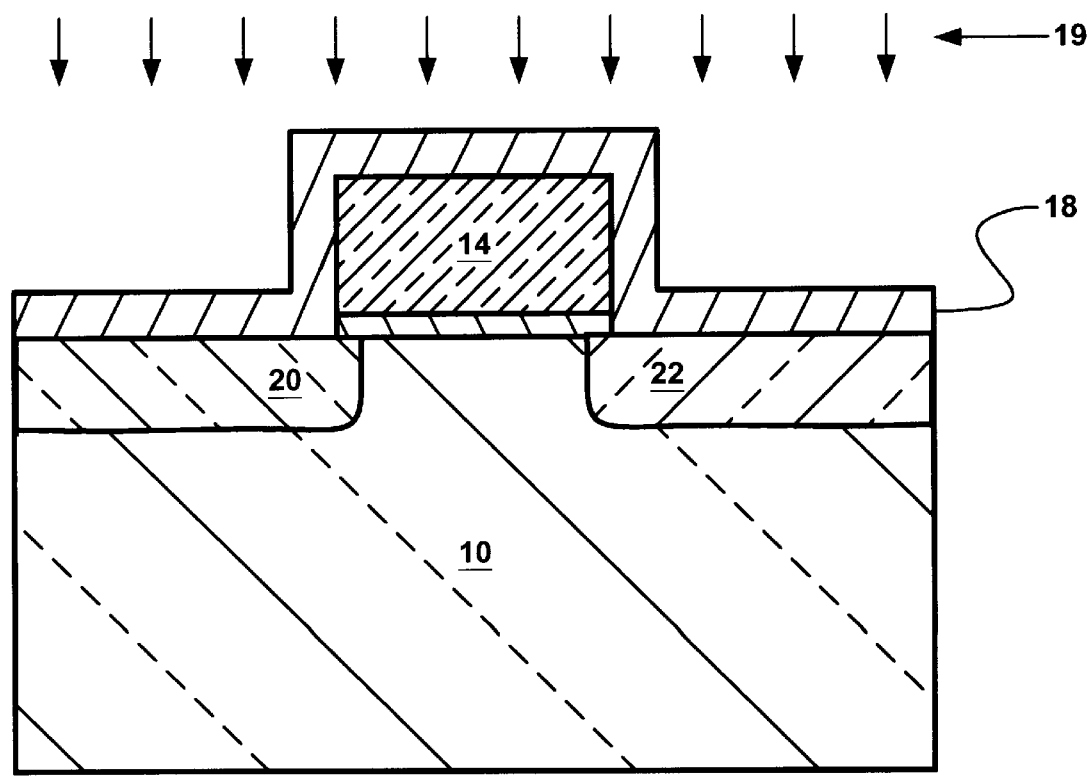
FIG. 4 is the semiconductor of FIG. 3 during shallow source and drain extension junction implantation.

Referring now to FIG. 4, therein is shown the boron implantation 19 of the silicon substrate 10 to form the initial ultra-shallow, P-silicon source and drain junctions in the well of N$^-$ silicon. These initial junctions are designated as source and drain extension junctions 20 and 22. They are formed by ion implantation through the screen oxynitride layer 18.

Figure 5:
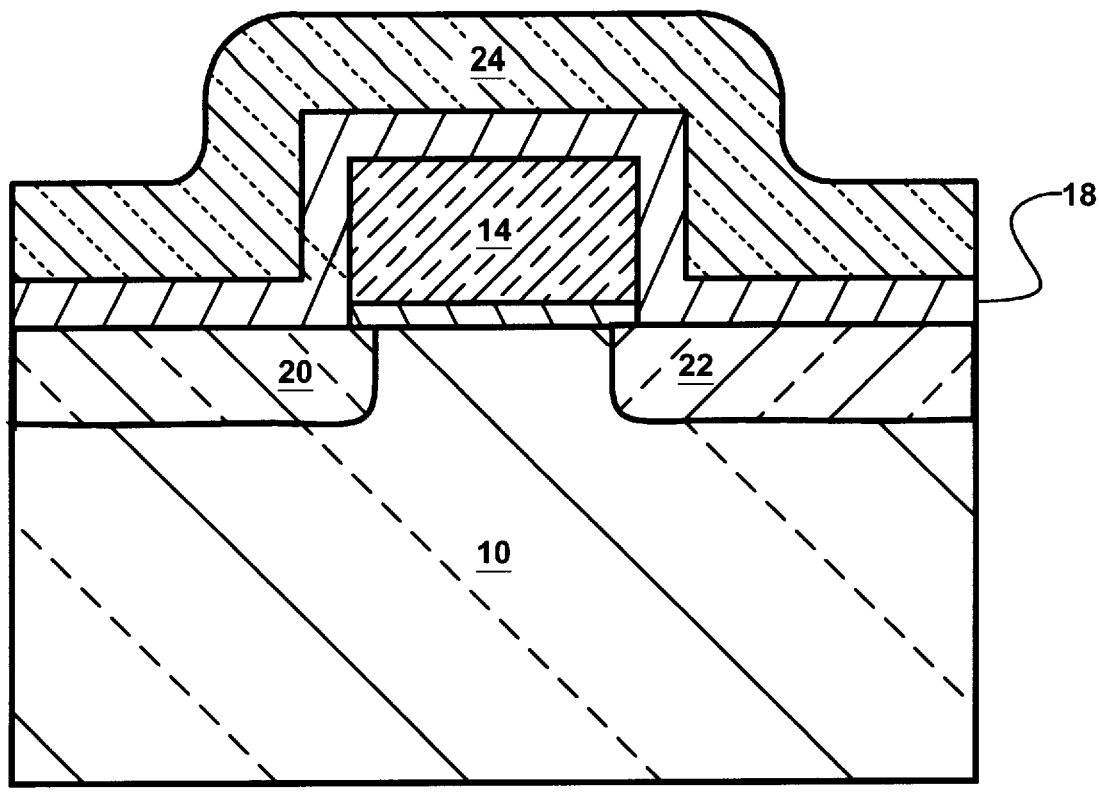
FIG. 5 is the semiconductor of FIG. 4 after conformal oxide layer deposition.

Referring now to FIG. 5, therein is shown a conformal oxide layer 24 deposited on the screen oxynitride layer 18.

Figure 6:
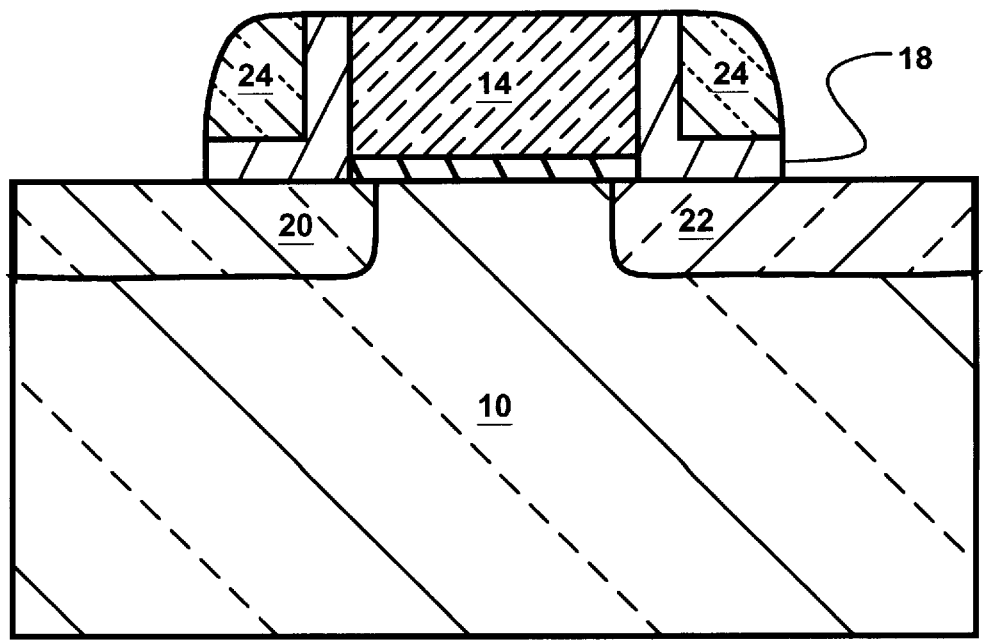
FIG. 6 is the semiconductor of FIG. 5 after spacer etching.

Referring now to FIG. 6, therein is shown the conformal oxide layer 24 and the screen oxynitride layer 18 after etching to form sidewall spacers and to expose the polysilicon gate 14 and the source and drain extension junctions 20 and 22.

Figure 7:
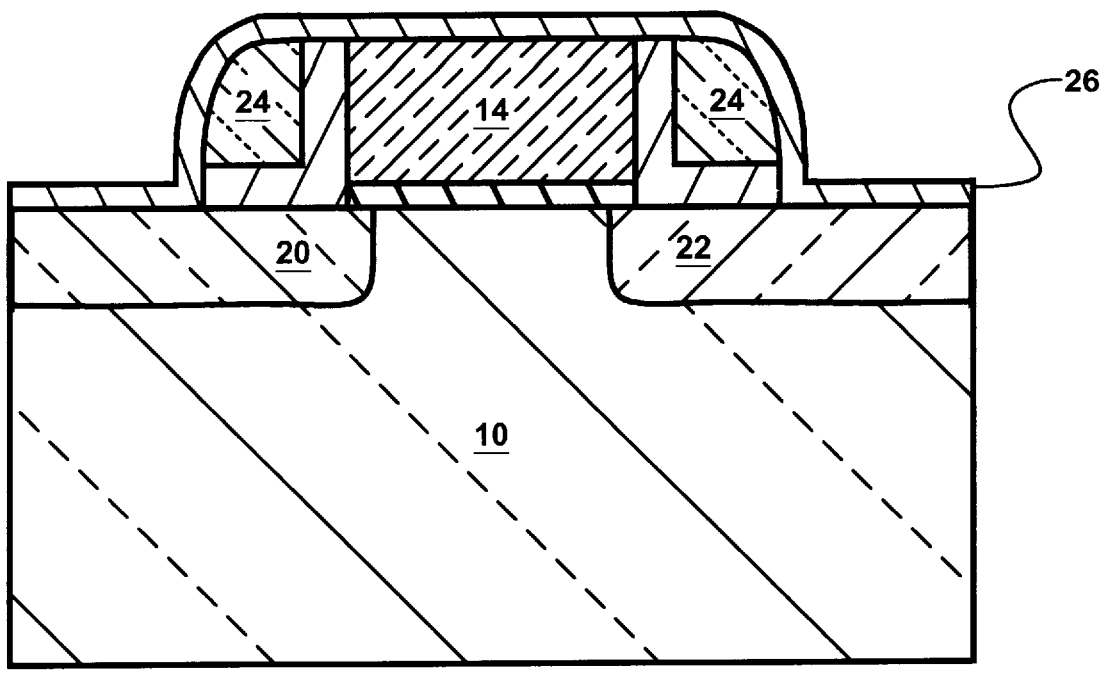
FIG. 7 is the semiconductor of FIG. 6 after screen oxide layer deposition.

Referring now to FIG. 7, therein is shown another, second screen oxide layer 26 deposited over the semiconductor wafer to cover the polysilicon gate 14 and the source and drain extension junctions 20 and 22.

Figure 8:
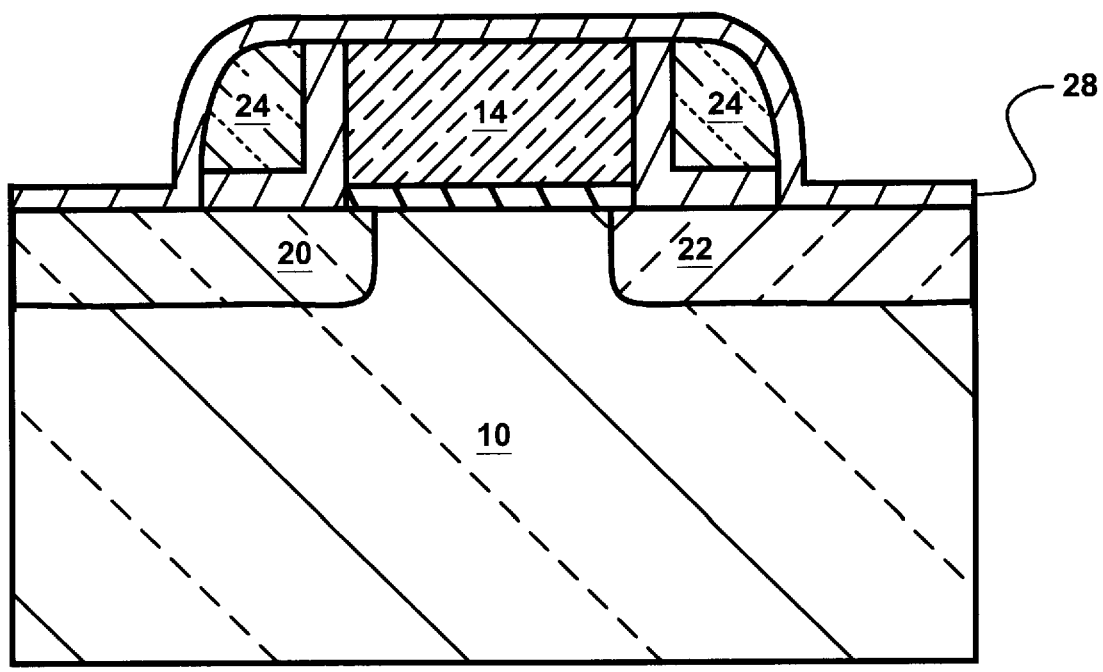
FIG. 8 is the semiconductor of FIG. 7 after screen oxide layer nitridation.

Referring now to FIG. 8, therein is shown a second screen oxynitride layer 28 after nitridation which converts the silicon dioxide of the screen oxide layer 26 of FIG. 7 into silicon oxynitride.

Figure 9:
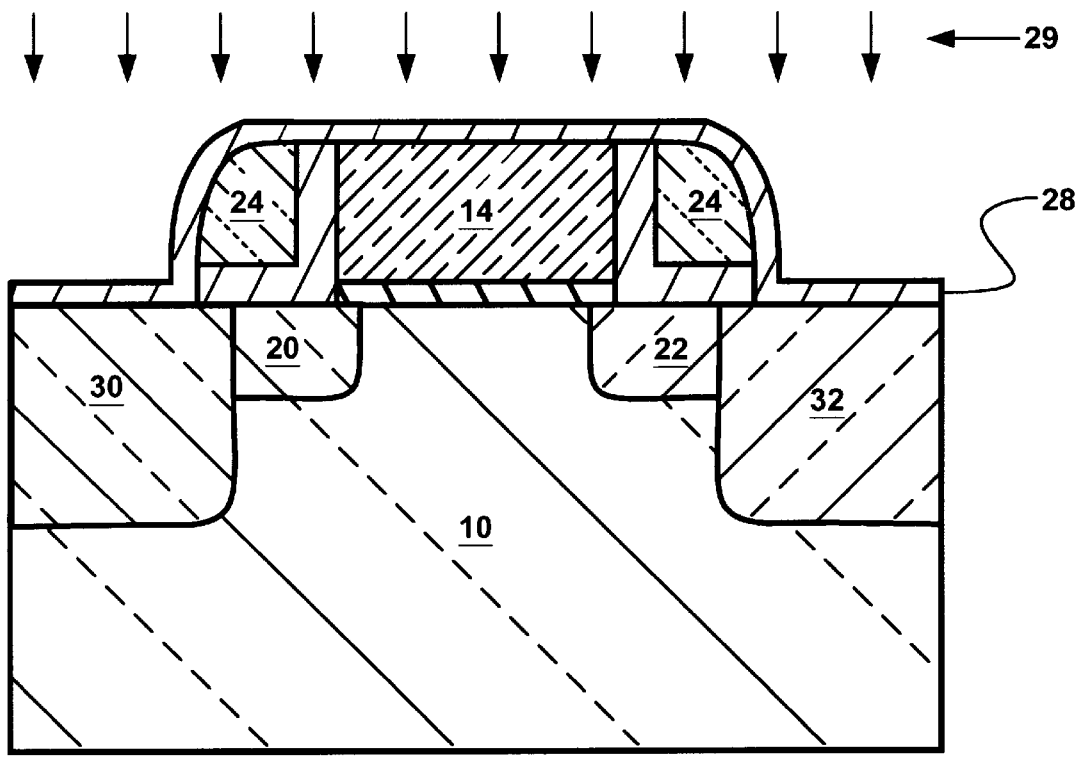
FIG. 9 is the semiconductor of FIG. 8 during deep source and drain junction implantation.

Referring now to FIG. 9, therein is shown another, second boron implantation 29 of the silicon substrate 10 to form the relatively deep P-silicon source and drain junctions in the well of N⁻ silicon. These junctions are designated as source and drain junctions 30 and 32, respectively, and are integral with the source and drain extension junctions 20 and 22. The source and drain junctions 30 and 32 are formed by ion implantation through the screen oxynitride layer 28.

Figure 10:
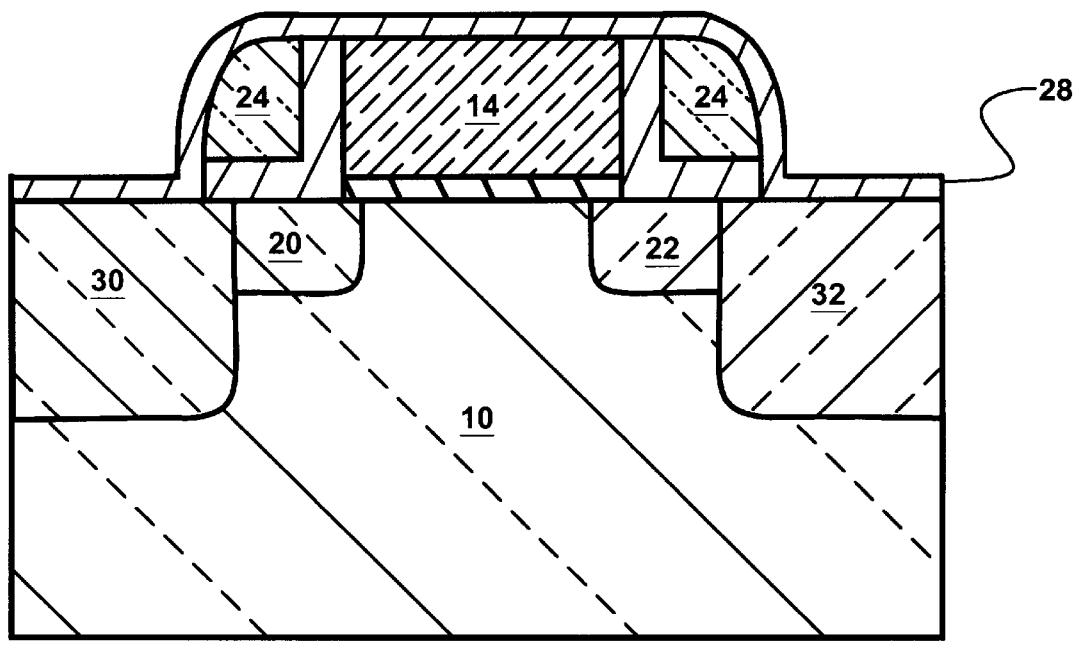
FIG. 10 is the semiconductor of FIG. 9 after rapid thermal annealing.

Referring now to FIG. 10, therein is shown the deep-submicron CMOS transistor after the rapid thermal annealing for boron activation.

Figure 11:
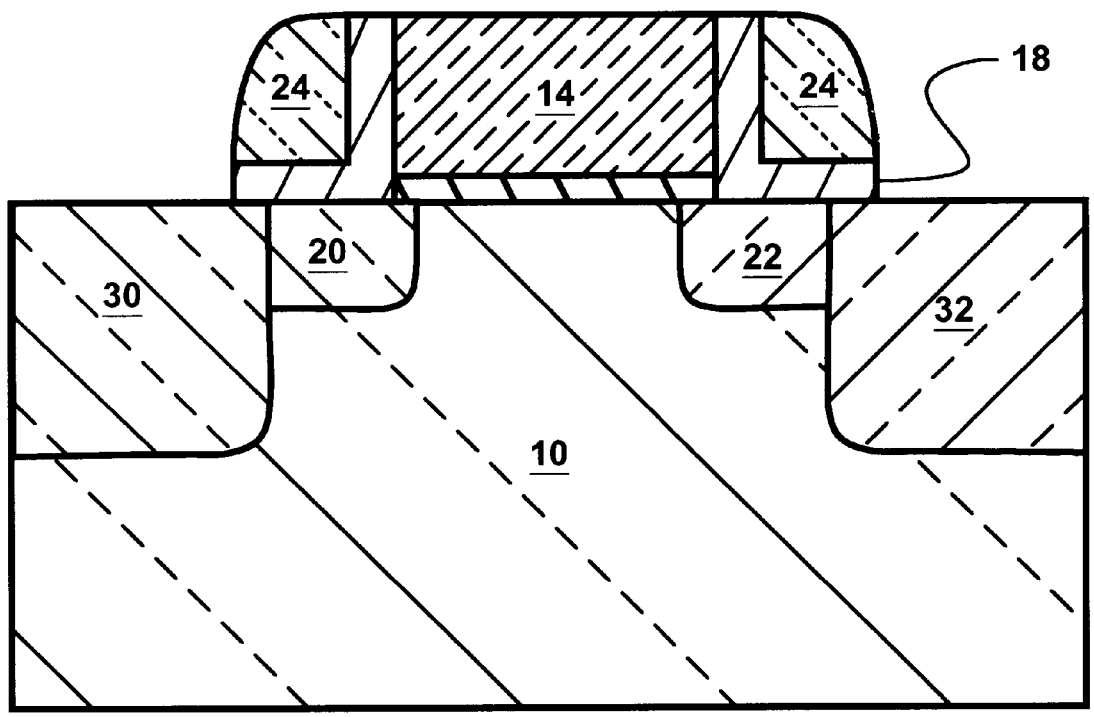
FIG. 11 is the semiconductor of FIG. 10 after removal of the screen oxynitride layer.

Referring now to FIG. 11, therein is shown the second screen oxynitride layer 28 etched away and the transistor ready for the remaining conventional processing. The remaining conventional processing would be evident to those skilled in the art as required to produce finished deep submicron (sub-0.1 micron) ultra large scale integrated (ULSI) circuit devices.

The process flow for the present invention starts with the silicon substrate 10 having been processed with wells of N⁻ silicon and the deposition of the silicon dioxide gate oxide layer 12 and the polysilicon gate 14. The screen oxide layer 16 of silicon dioxide is then deposited as shown in FIG. 2, generally by low pressure chemical vapor deposition (LPCVD).

Next, a nitridation of the screen oxide layer 16 is performed. The nitridation is a rapid thermal annealing process in a gaseous nitrogen compound ambient. The rapid thermal annealing temperature would be around 900° C. for 30 seconds. The gaseous nitrogen compounds include ammonia (NH$_3$), nitric oxide (NO), and nitrous oxide (N$_2$O). Furnace annealing can also be used, but rapid thermal annealing is preferred for less doping redistribution. Furthermore, ammonia and nitric oxide rapid thermal annealing in particular are preferred, because they can incorporate more nitrogen into the screen oxide layer 16 with a peak near the interface with the silicon substrate 10.

As the result of the nitridation, the pure oxide of the screen oxide layer 16 will be turned into an oxynitride to form the screen oxynitride layer 18, as shown in FIG. 3. The fundamental principle is that nitrogen in oxides can significantly suppress boron diffusion and segregation into the oxides.

After the nitridation process, a dopant is implanted through the screen oxynitride layer 18 into the silicon substrate 10 to form the ultra-shallow, P-silicon source and drain extension junctions 20 and 22, as shown in FIG. 4. The conduction-increasing boron (B) dopant for P-silicon formation is ion implanted as elemental boron or as boron difluoride (BF$_2$). The screen oxynitride layer 18, as previously explained, prevents the boron dopant from segregating from the silicon substrate 10 and maintains a high boron concentration in the silicon substrate 10 during the later rapid thermal anneals.

Next, the conformal oxide layer 24 is deposited over the screen oxynitride layer 18, as shown in FIG. 5. The conformal oxide layer 24 and the screen oxynitride layer 18 are then subject to an anisotropic reactive ion etch (RIE) process to arrive at the configuration shown in FIG. 6. The anisotropic etch uses the silicon of the silicon substrate 10 and of the polysilicon gate 14 as etch stops, and the etching continues until the silicon is exposed. This leaves the conformal oxide layer 24 as oxide spacers 24 against the oxynitride on the sides of and around the polysilicon gate 14.

Another second screen oxide layer 26 is then deposited again by LPCVD over the wafer, as shown in FIG. 7, and another nitridation is performed. The conditions of this second nitridation would be the same as previously described for the first nitridation step. Again, this turns the pure oxide in the screen oxide layer 26 of FIG. 7 into oxynitride to form the second screen oxynitride layer 28, as shown in FIG. 8.

Again, boron (B) or boron difluoride (BF$_2$) is ion implanted through the screen oxynitride layer 28 into the silicon substrate 10 as shown in FIG. 9. This time, the implantation of the source and drain junctions 30 and 32 proceeds to create relatively deep junctions as compared to the ultra-shallow extension junctions 20 and 22. The oxide layer 24 absorbs the boron near the polysilicon gate 14 and prevents the shallow extension junctions 20 and 22 from getting significantly deeper.

A final rapid thermal anneal of the present invention is performed in a gaseous nitrogen (N$_2$) atmosphere for activation of the boron in the silicon substrate 10, as shown in FIG. 10. Typical conditions are a temperature of about 1050° C. and a time of about 30 seconds. Because of the screen oxynitride layer 28 on the surface of silicon substrate 10 in the boron implanted region, the segregation of boron from these implanted regions will be significantly suppressed or even totally stopped. This boron retention will improve the conductivity of the implanted region consisting of the source and drain extension junctions and junctions 20, 22, 30, and 32. This reduces the series resistance and increases the drive current of ULSI circuit devices.

A removal of the screen oxynitride layer 28 is carried out after the above final rapid thermal anneal by conventional wet etching to arrive at the configuration shown in FIG. 11. After this step, process flow of the ULSI device fabrication is conventional.

This process flow is totally compatible with the current CMOS technology and requires only very minor, but elegant, changes to the current CMOS technology. Only two additional nitridation steps are needed in the current CMOS process flow and each nitridation is a simple RTA in an ambient of NH$_3$, NO, or N$_2$O.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for suppressing dopant segregation in the manufacturing of a semiconductor having a gate on a semiconductor substrate, comprising the steps of:

depositing a screen layer on the semiconductor substrate in contact with the sides of the gate;

processing said screen layer to form a dopant segregation prevention screen layer;

implantation of dopant to form extension junctions through said dopant segregation prevention screen layer at the gate whereby dopant segregation at the gate is prevented;

depositing a conformal layer over said dopant segregation prevention screen layer;

removing said dopant segregation prevention screen layer and said conformal oxide layer spaced away from the gate until the semiconductor substrate is exposed;

depositing a second screen layer over the exposed semiconductor substrate spaced away from the gate;

processing of said second screen layer to form a second dopant segregation prevention screen layer; and implantation of dopant to form junctions through said second dopant segregation prevention screen layer away from the gate.

2. The method as claimed in claim 1 wherein the steps of processing include rapid thermal annealing.

3. The method as claimed in claim 1 wherein the steps of processing include rapid thermal annealing in a dopant segregation prevention ambient.

4. The method as claimed in claim 1 wherein the steps of implantation are by ion implantation of a Group III element dopant.

5. The method as claimed in claim 1 wherein the steps of implantation are by ion implantation of a Group V element dopant.

6. A method for suppressing boron segregation in the manufacturing of a semiconductor having a gate on a gate oxide on a semiconductor substrate, comprising the steps of:

depositing a screen oxide layer on the semiconductor substrate in contact with the sides of the gate and the gate oxide;

nitridation of said screen oxide layer with rapid thermal annealing to form a screen oxynitride layer;

implantation of dopant to form source and drain extension junctions through said screen oxynitride layer at the gate whereby dopant segregation at the gate is prevented;

depositing a conformal oxide layer on said screen oxynitride layer;

etching said screen oxynitride layer and said conformal oxide layer until the top of the gate and portions of said source and drain extension junctions are exposed while the sides of the gate remain covered by said conformal oxide layer;

depositing a second screen oxide layer over said conformal oxide layer, the gate, the gate oxide, and said source and drain extension junctions;

nitridation of said second screen oxide layer with rapid thermal annealing to form a second screen oxynitride layer; and implantation of dopant through said second screen oxynitride layer into the semiconductor substrate to form source and drain junctions spaced away from the gate.

7. The method as claimed in claim 6 wherein the steps of nitridation includes rapid thermal annealing at around 1050° C. for 30 seconds in a gaseous nitrogen compound ambient.

8. The method as claimed in claim 6 wherein the steps of nitridation includes rapid thermal annealing at around 900° C. for 30 seconds in a gaseous nitrogen compound ambient.

9. The method as claimed in claim 6 wherein the step of implantation is by ion implantation of boron.

10. The method as claimed in claim 6 wherein the step of implantation is by ion implantation of a Group V element dopant.

11. A method for suppressing boron segregation in the manufacturing of a semiconductor processed to the placement of a transistor gate over an oxide layered N⁻ silicon substrate, comprising the steps of:

chemical vapor deposition of a screen oxide layer over the transistor gate and the oxide layered N⁻ silicon substrate:

nitridation of said screen oxide layer by rapid thermal annealing at around 900° C. for 30 seconds in a gaseous nitrogen compound ambient to form a screen oxynitride layer;

implantation of boron dopant to form P-silicon source and drain extension junctions through said screen oxynitride layer in N⁻ silicon substrate next to the gate;

depositing a conformal oxide layer over said screen oxynitride layer;

etching said conformal oxide layer and said screen oxynitride layer to form a spacer against the sidewalls of the gate and to expose the top of the gate and said source and drain extension junctions away from the gate;

depositing a second screen oxide layer over said conformal oxide layer, the gate and said source and drain extension junctions;

second nitridation of said second screen oxide layer by rapid thermal annealing at around 900° C. for 30 seconds in a gaseous nitrogen compound ambient to form a second screen oxynitride layer;

second implantation of boron dopant through said second screen oxynitride layer to deepen portions of said P-silicon source and said drain junctions in the N⁻ silicon substrate away from the gate;

rapid thermal annealing at around 1050° C. for 30 seconds in a gaseous nitrogen ambient to activate said boron; and removal of said second screen oxynitride layer.

* * * * *